(12) United States Patent
Cheng et al.

(10) Patent No.: US 8,354,331 B2
(45) Date of Patent: Jan. 15, 2013

(54) MULTIPLYING PATTERN DENSITY BY SINGLE SIDEWALL IMAGING TRANSFER

(75) Inventors: Kangguo Cheng, Albany, NY (US); Bruce B. Doris, Albany, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 12/628,686

(22) Filed: Dec. 1, 2009

(65) Prior Publication Data

US 2011/0127582 A1 Jun. 2, 2011

(51) Int. Cl.
*H01L 21/20* (2006.01)
*H01L 21/00* (2006.01)

(52) U.S. Cl. ......................... 438/479; 438/800
(58) Field of Classification Search ............... 438/479, 438/800
See application file for complete search history.

(56) References Cited

U.S. PATENT DOCUMENTS

| | | | |
|---|---|---|---|
| 6,391,753 B1 | 5/2002 | Yu | |
| 6,875,703 B1 | 4/2005 | Furukawa et al. | |
| 7,560,390 B2 * | 7/2009 | Sant et al. | 438/717 |
| 7,611,980 B2 * | 11/2009 | Wells et al. | 438/597 |
| 7,696,101 B2 * | 4/2010 | Li | 438/736 |
| 7,807,575 B2 * | 10/2010 | Zhou | 438/696 |
| 2004/0012038 A1 * | 1/2004 | Kouzuki et al. | 257/200 |

* cited by examiner

*Primary Examiner* — Fernando L Toledo
*Assistant Examiner* — Karen Kusumakar
(74) *Attorney, Agent, or Firm* — Tutunjian & Bitetto, P.C.; Louis Percello

(57) ABSTRACT

A method for fabricating an integrated circuit includes patterning a mandrel over a layer to be patterned. Dopants are implanted into exposed sidewalls of the mandrel to form at least two doped layers having at least one undoped region adjacent to the doped layers. The doped layers are selectively etched away to form pillars from the undoped regions. The layer to be patterned is etched using the pillars as an etch mask to form features for an integrated circuit device. A semiconductor device is also disclosed.

19 Claims, 7 Drawing Sheets

MULTIPLYING PATTERN DENSITY BY SINGLE SIDEWALL IMAGING TRANSFER

BACKGROUND

1. Technical Field

The present invention relates to semiconductor processing and more particularly to fabrication of components with density multiplication in a single process sequence.

2. Description of the Related Art

Vertically disposed transistors formed on fins or fin field effect transistors (FinFETs) have been emerging as a promising new approach for continued scaling of complementary metal oxide semiconductor (CMOS) technology. Sidewall spacer imaging transfer (SIT) is one method for forming narrow fins beyond the printing capability of optical lithography. Conventional SIT methods result in a pattern density that is finer than conventional lithographic patterning techniques. However, as demand grows for increased semiconductor component density, improvements to conventional SIT methods are needed.

In prior art processes, pattern density can be doubled by conventional sidewall imaging transfer (SIT) as described in U.S. Pat. No. 6,391,753. Another method includes performing the SIT process multiple times. While this can further increase pattern density, multiple SIT processes adds process complexity and increases process cost. For example, pattern density can be quadrupled by performing the SIT process two times, as described, e.g., in U.S. Pat. No. 6,875,703.

SUMMARY

A method for fabricating an integrated circuit includes patterning a mandrel over a layer to be patterned. Dopants are implanted into exposed sidewalls of the mandrel to form at least two doped layers having at least one undoped region adjacent to the doped layers. The doped layers are selectively etched away to form pillars from the undoped regions. The layer to be patterned is etched using the pillars as an etch mask to form features for an integrated circuit device.

A method for fabricating an integrated circuit includes patterning a mandrel over a substrate, the mandrel having a mask layer formed thereon; implanting dopants into exposed sidewalls of the mandrel to form two buried layers having undoped regions adjacent to the buried layers; removing the mask layer; selectively etching away the buried layers to form pillars from the undoped regions; and etching the substrate using the pillars as an etch mask to form features for an integrated circuit device.

Another method for fabricating an integrated circuit includes patterning a mandrel over a substrate, the mandrel having a mask layer formed thereon; implanting dopants into exposed sidewalls of the mandrel to form two surface layers having an undoped region therebetween; epitaxially growing undoped regions on two surface layers of the exposed sidewalls; removing the mask layer; selectively etching away the surface layers to form pillars from the undoped regions; and etching the substrate using the pillars as an etch mask to form features for an integrated circuit device.

A semiconductor device includes a substrate having transistors formed thereon. The transistors have a triple density pattern such that at least three transistors are formed within a single minimum feature size achievable with lithography, and the transistors of the triple density pattern have one of different sizes and different spacings between at least two of the three features.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
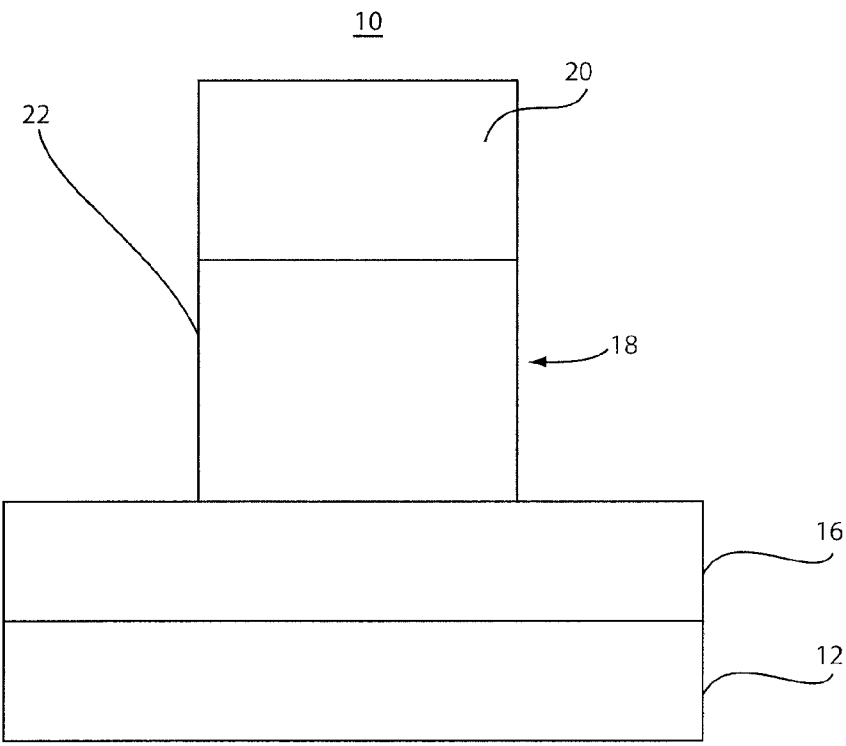
FIG. 1 is a cross-sectional view of a semiconductor wafer or device including a substrate having a pad layer, a mandrel layer where the mandrel layer is patterned to form a mandrel and a cap or mask layer formed thereon.

In accordance with the present principles, a multiple pattern density process is provided having greater than two times the density of a single surface image transfer (SIT) process. In one embodiment, using a SIT with multiple pattern density, a triple density is achieved in a single SIT process. This embodiment includes forming an undoped mandrel on a substrate and implanting dopants into the mandrel from sidewalls to form an alternating doped-undoped pattern. The doped portion is removed selective to the undoped portion to form the triple pattern density. The pattern is then transferred into the substrate. In addition, the process provides flexibility to enable the formation of patterns with different widths in the same single SIT process.

It is to be understood that the present invention will be described in terms of a given illustrative architecture on a wafer; however, other architectures, structures, substrate materials and process features and steps may be varied within the scope of the present invention.

The structure as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a method and structure for tripling pattern density by a single SIT process will be illustratively described. A partially fabricated structure of a semiconductor device 10 is shown. In one embodiment, a substrate 12 may include a semiconductor-on-insulator substrate (SOI) having a silicon base layer with an oxide layer (BOX layer) and a silicon on oxide layer. It should be understood that the substrate 12 may include any suitable material and is not limited to SOI. For example, substrate 12 may include gallium arsenide, monocrystalline silicon, germanium, or any other bulk material or combination of materials. In some embodiments, the substrate 12 further comprises other features or structures that are formed on or in the semiconductor substrate in previous process steps. Further, the present principles may be applied to inter-level dielectric layers, metal layers or any other layer and particularly when sub-minimum features sized structures are useful.

A pad layer 16 may be formed on substrate 12. The pad layer 16 may include an oxide (e.g., silicon dioxide), a nitride (e.g., silicon nitride) or other dielectric material. Other materials may also be employed, such as organic dielectrics, etc. An undoped mandrel layer 18 is formed on the pad layer 16. In one embodiment, the mandrel layer 18 includes polycrystalline (polysilicon) or amorphous silicon. A mask layer 20 is formed over the mandrel layer 18. The mask layer 20 and the mandrel layer 18 are patterned and etched. This may include using a lithographic process that may include a resist layer (not shown) to lithographically pattern and etch the mask layer 20. Resist is removed and mask layer 20 is employed as a mask to etch the mandrel layer 18. In other embodiments, the resist or other material may be employed to etch through the mask layer 20 and the mandrel layer 18 in a single process step. The etching forms a mandrel 22.

Figure 2:
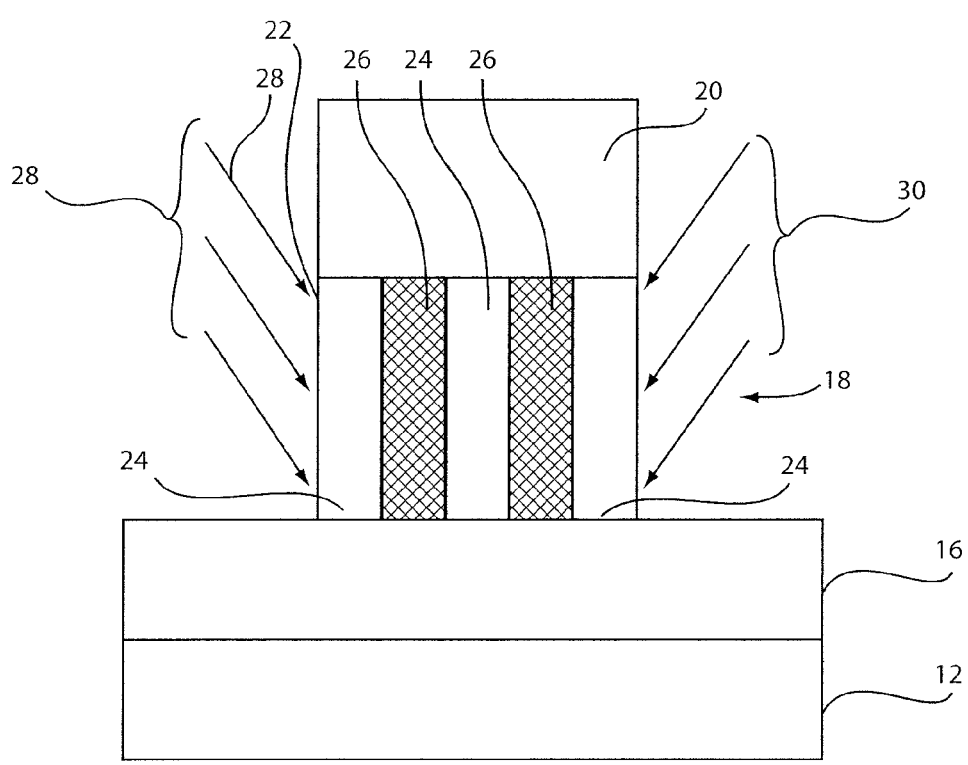
FIG. 2 is a cross-sectional view of the device of FIG. 1 showing the mandrels subjected to angled ion implantation processes to form doped buried layers in the mandrel.

Referring to FIG. 2, a dopant implantation process is performed. Dopants 28 and 30 are directed on an angle against sidewalls of the mandrel 22 to form an alternating doped-undoped pattern. Using angled ion implantation (I/I), doped portions 26 and undoped portions 24 of mandrel 22 are formed. Dopants 28 and 30 are introduced in a same implantation process (e.g., using a same or different sources) or may be applied in separate processes (doing one side first e.g., with dopants 28 and then the other side, e.g., with dopants 30). Dopant energy is controlled to accurately define the doped regions 26. Dopants 28 and 30 may include phosphorus (P), arsenic (As), boron (B), indium (In), antimony (Sb), germanium (Ge), nitrogen (N), fluorine (F), carbon (C), sulfur (S), etc.

Figure 3:
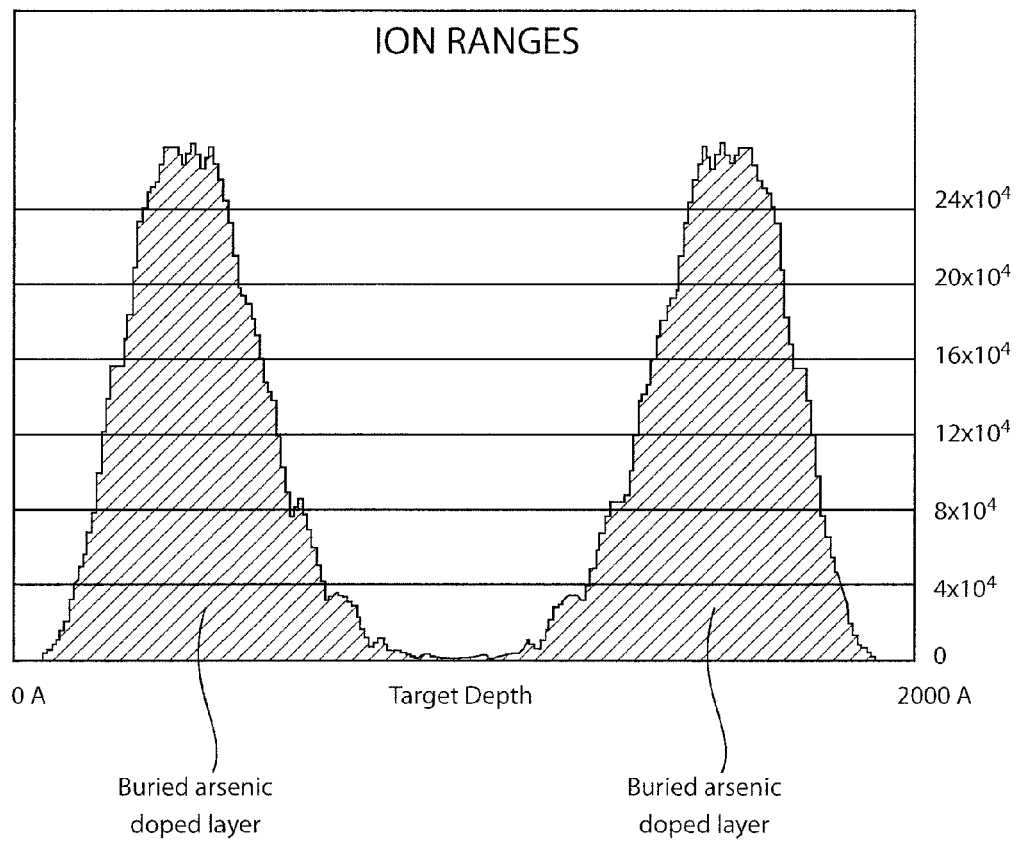
FIG. 3 is a plot of density/surface area of atoms versus target depth for arsenic to demonstrate ion ranges in accordance with the angled implantation processes.

Referring to FIG. 3, atoms (density over surface area) are plotted verses target depth for arsenic dopants in an illustrative plot. As can be seen from FIG. 3, well-defined dopant distributions are achieved which are buried in the mandrel 22 at a desired target depth. The target depth can be accurately controlled based upon implantation energy, material choice (dopant material and target material) and other factors.

Referring again to FIG. 2, as a result of the implantation process, doped regions 26 have an etch rate that is different from undoped portions 24. Angled ion implantation includes bombarding the mask layer 20, mandrel 22 and pad layer 16 with ions at angles of approximately 5 degrees to about 75 degrees with respect to a vertical, normal to a major surface of the device. Other angles of attack may also be employed. It should be noted that the thicknesses of pad layer 16 and mask layer 20 should be large enough to protect underlying layers and structures during the implantation. For example, the target depth should be less than the thicknesses of the mask layer 20 and the pad layer 16. Depending on the target depth and implant species, the implant dose can range from $1 \times 10^{12}/cm^2$ to $5 \times 10^{15}/cm^2$, the implant energy can range from 0.5 KeV to 500 KeV. Although two buried doped layers (portions 26) are formed by an implantation process, multiple buried doped layers (more than 2) can be formed by multiple implantations with different implantation energies and/or angles.

Figure 4:
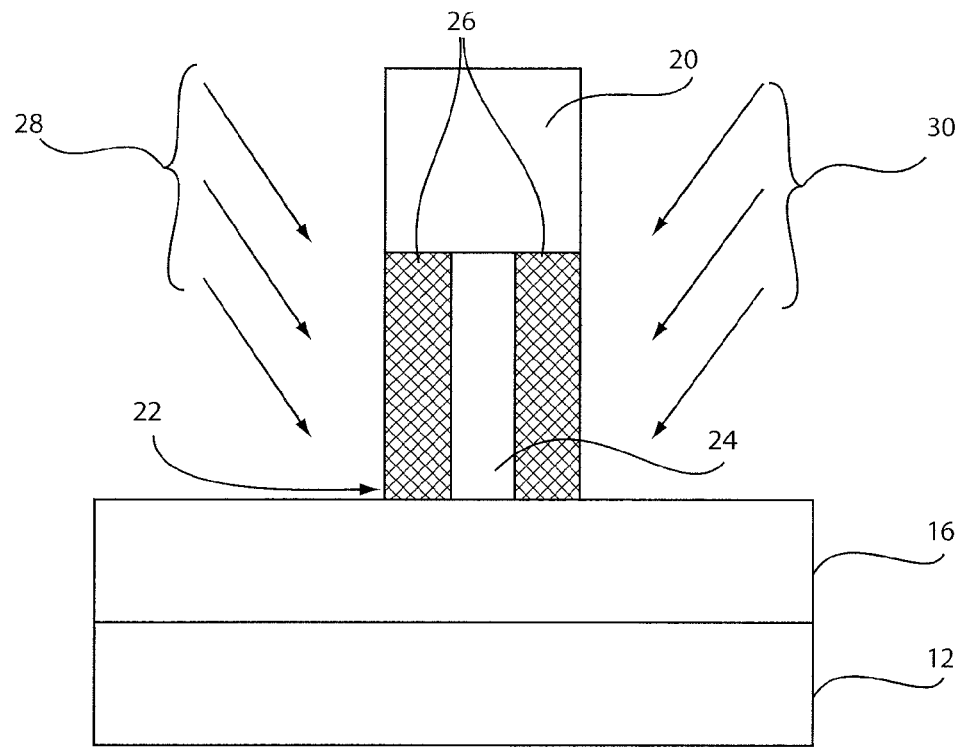
FIG. 4 is a cross-sectional view of the device of FIG. 2 showing the mandrels subjected to angled ion implantation processes to form doped surface layers in the mandrel in accordance with an alternate embodiment.

Referring to FIG. 4, in an alternate embodiment, the ion implantation process is performed with less energy and results in a much shallower target depth for the ions. In one embodiment, the doped portions of mandrel 22 begin at the surface of the mandrel 22.

Figure 5:
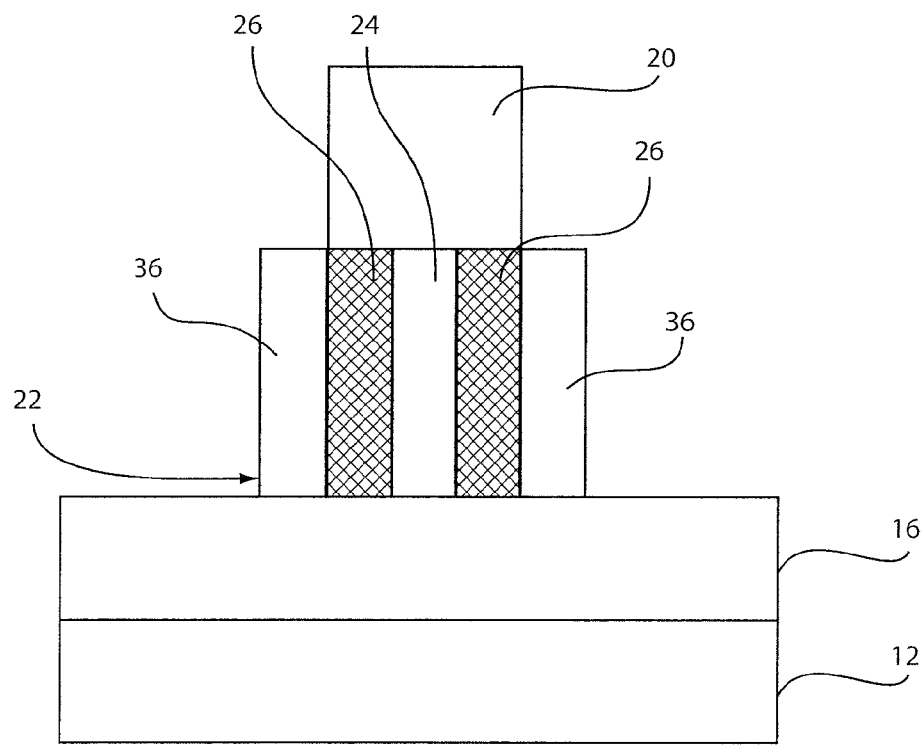
FIG. 5 is a cross-sectional view of the device of FIG. 4 showing undoped layers epitaxially grown on the surface layers.
Figure 6:
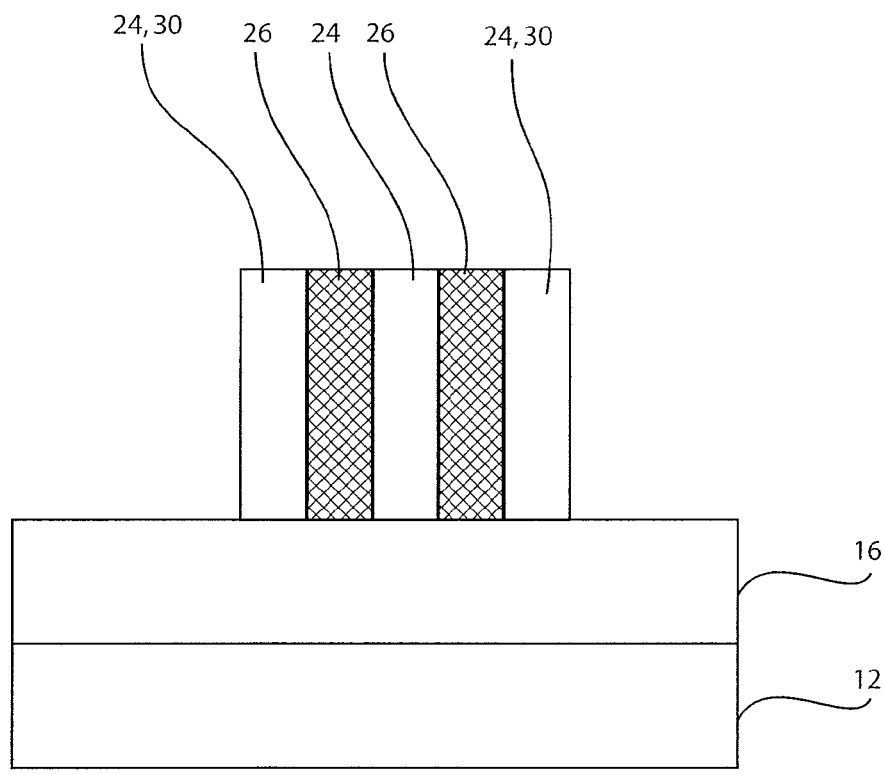
FIG. 6 is a cross-sectional view of the device of FIG. 2 or 5 showing the mandrel including an alternating doped/undoped pattern with the mask layer removed.

Referring to FIG. 5, undoped epitaxially grown layers 36 are formed on sidewalls of the mandrel 22. The grown layers 36 may include undoped silicon to form the same structure as provided in FIG. 2. This structure is depicted in FIG. 6. Note that in other embodiments, the mandrel structures may have doped portions 26 switched with undoped portions 24. This can be achieved by, e.g., adjusting the implantation depths, or by, e.g., epitaxially growing doped silicon layers (36), etc. Note that the epitaxial growth may be implanted with dopants in an angled implantation process, and that the ion implantation and epitaxial processes can be repeated to form more than 2 buried doped layers.

Referring to FIG. 6, a resulting structure from FIG. 2 or FIG. 5 is depicted after the mask layer 20 has been removed. This exposes an upper portion of the doped portions 26 and the undoped portions 24 (or 30) so that selective etching may be performed.

Figure 7:
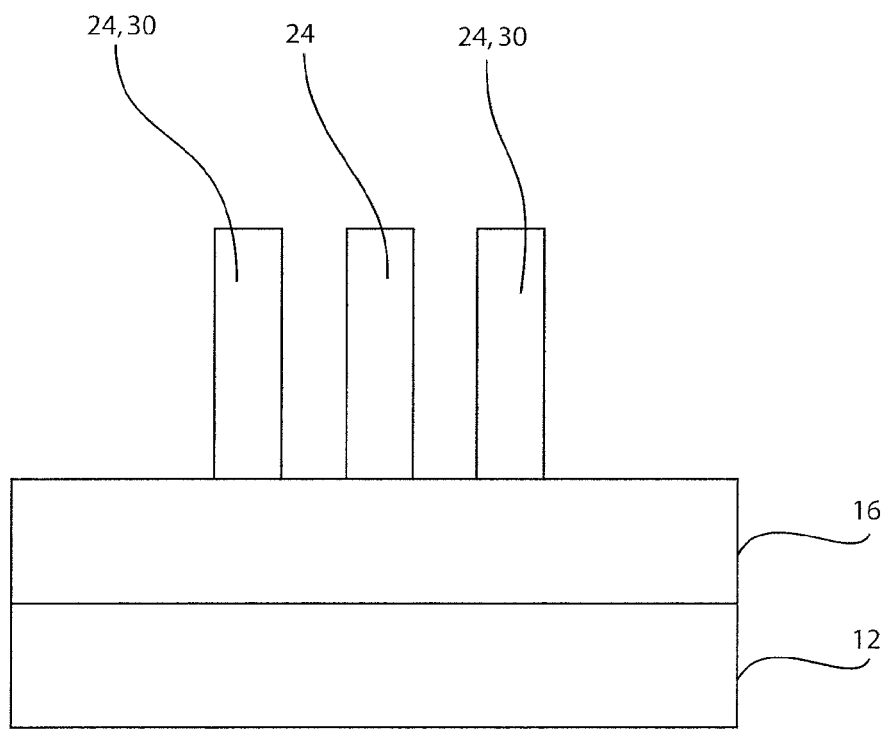
FIG. 7 is a cross-sectional view of the device of FIG. 6 showing the mandrel exposed to an etch process to remove the doped regions or portions to form pillars in the mandrel.

Referring to FIG. 7, the doped portions 26 are removed selective to the undoped portions 24 (and/or 30) to form a triple pattern density. The doped portions 26 have an etch rate that is significantly higher than the etch rate of the undoped portions 24 (and/or 30). An etch process, such as, a wet ammonia etch or dry etch may be employed to remove the doped regions. The remaining undoped portions 24 (and/or 30) form pillars which will be employed in transferring the triple density pattern into the pad layer 16 and the substrate 12.

It should be understood that while the widths of the undoped portions 24, 30 can be configured to be any size, the widths are preferably less than a minimum feature size provided by state of the art lithography techniques. In this way, device density is significantly increased. Further, spacings between the pillars (between undoped portions 24, 30) may vary from larger than a minimum feature size achievable by lithography to less than a minimum feature size achievable by lithography so that sub-minimum feature sized features are fabricated.

Figure 8:
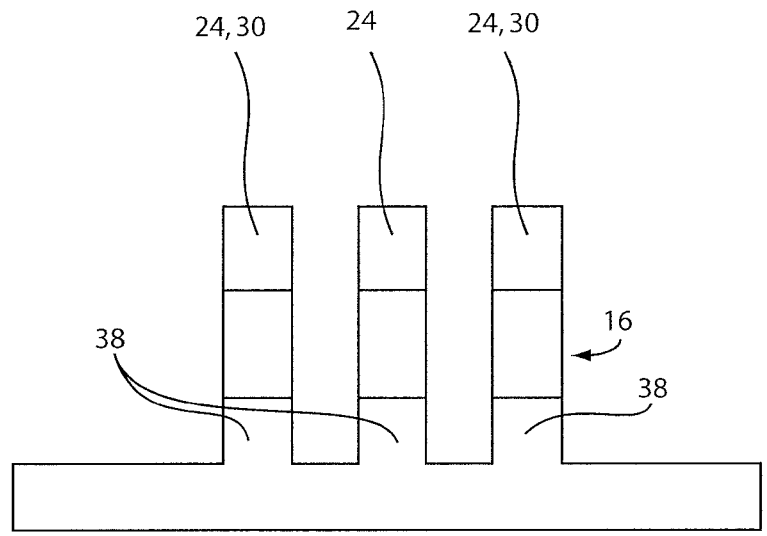
FIG. 8 is a cross-sectional view of the device of FIG. 7 showing the pillars forming a mask for processing underlying layers.

Referring to FIG. 8, using the undoped portions 24 (and/or 30) as a mask, etching is performed to remove unprotected areas of the pad layer 16 and to open up regions in the substrate 12 to form fins 38 or other structures. The etching preferably includes a dry etch or reactive ion etch. Fins 38 are employed as active areas for fin field effect transistors (finFETs) which may be constructed using known processes. The finFETs are formed by depositing a gate dielectric and gate conductor, followed by patterning of these layers and active area implantation of dopants.

The buried layer dopant implantation preferably provides for three fins 38 in a same area as the conventional SIT process which only provides two. In addition, the process is simplified over the multiple application of the SIT process which requires many redundant and added steps. The present methods provide triple density in a single process sequence; however higher densities are also contemplated.

Figure 9:
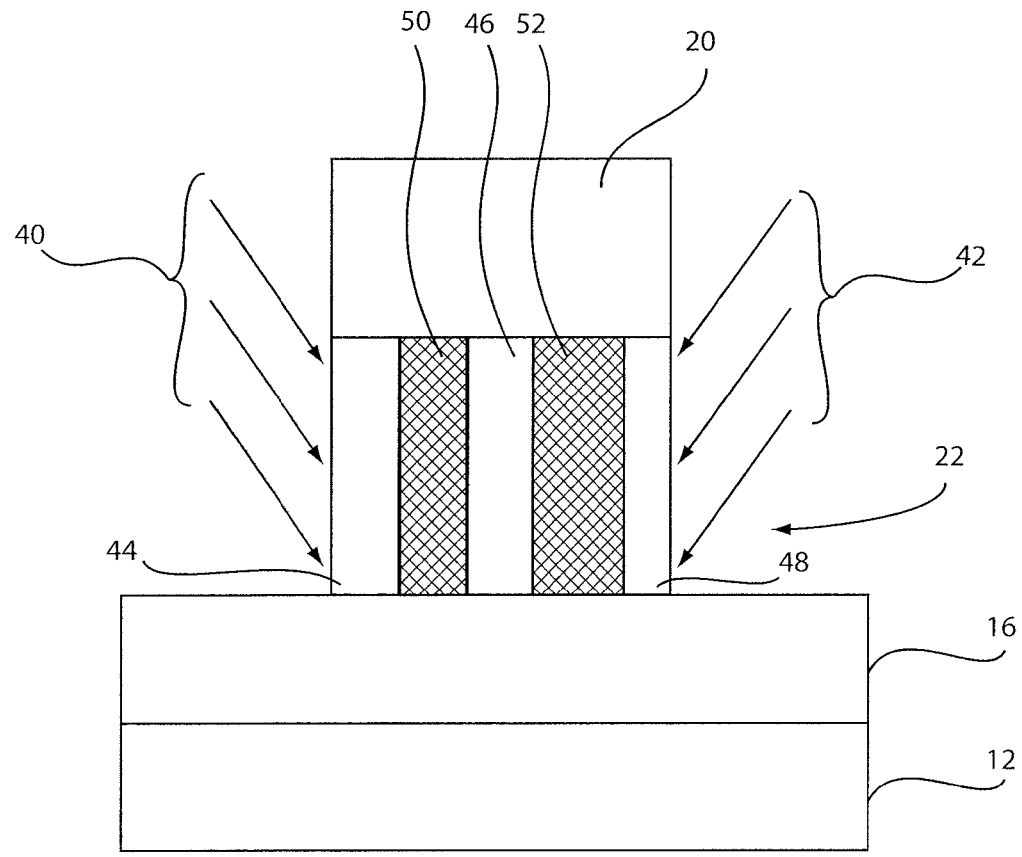
FIG. 9 is a cross-sectional view of a device showing angled ion implantation to form doped regions of different width and/or depths in accordance with an alternate embodiment.

Referring to FIG. 9, in an alternate embodiment, the mandrel 22 may be processed in a plurality of ways. In one embodiment, the widths of doped portions 50 and 52 and undoped portions 44, 46 and 48 can be adjusted while forming an alternating undoped/doped pattern in the mandrel 22. In the example of FIG. 9, a triple pattern density is formed with different pattern dimensions without adding extra process steps. In this embodiment, two angled implants, one with dopants 40 and one with dopants 42 have different implantation conditions such that the dimensions and positions of the doped portions 50 and 52 are varied according to a desired pattern. By selecting the dopants, the target depth, the ion range, etc., the doped portion pattern defines pillars formed for masking by the undoped portions 44, 46, 48.

Figure 10:
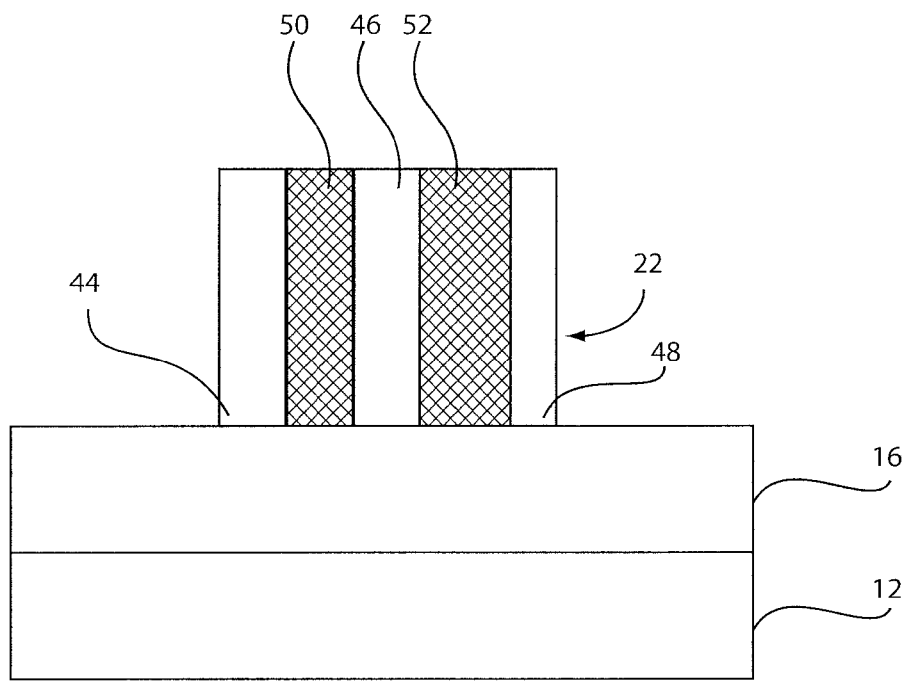
FIG. 10 is a cross-sectional view of the device of FIG. 9 showing the mandrel including an alternating doped/undoped pattern with the mask layer removed.

Referring to FIG. 10, the mask layer 20 is stripped. Doped portion 52 is wider than the doped portion 50. In addition, portion 52 is closer to a surface of the sidewall of the mandrel 22 than the doped portion 50.

Figure 11:
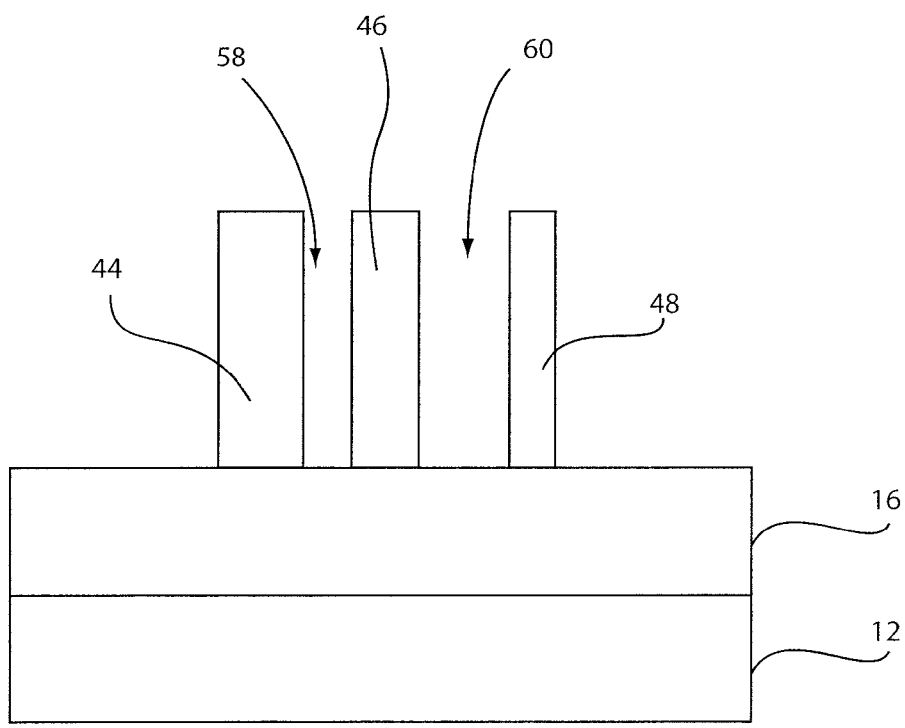
FIG. 11 is a cross-sectional view of the device of FIG. 10 showing the mandrel exposed to an etch process to remove the doped regions or portions to form pillars in the mandrel of different spacing and width.

Referring to FIG. 11, an etch of the undoped portions 50 and 52 is performed. For example, the doped portions 50 and 52 are etched selective to undoped portions 44, 46, 48 (e.g., by wet ammonia etch or dry etch). Three undoped portions (pillars) 44, 46, 48 have different widths. These widths may vary from larger than a minimum feature size achievable by lithography to less than a minimum feature size achievable by lithography. The spacings 58, 60 between neighboring pillars (44, 46, 48) can be the same or different as needed. The spacings 58 and 60 will be employed to provide the widths of underlying features. These spacings 58 and 60 may vary from larger than a minimum feature size achievable by lithography to less than a minimum feature size achievable by lithography. Processing continues from this point as described above to form finFETs, or other components.

Figure 12:
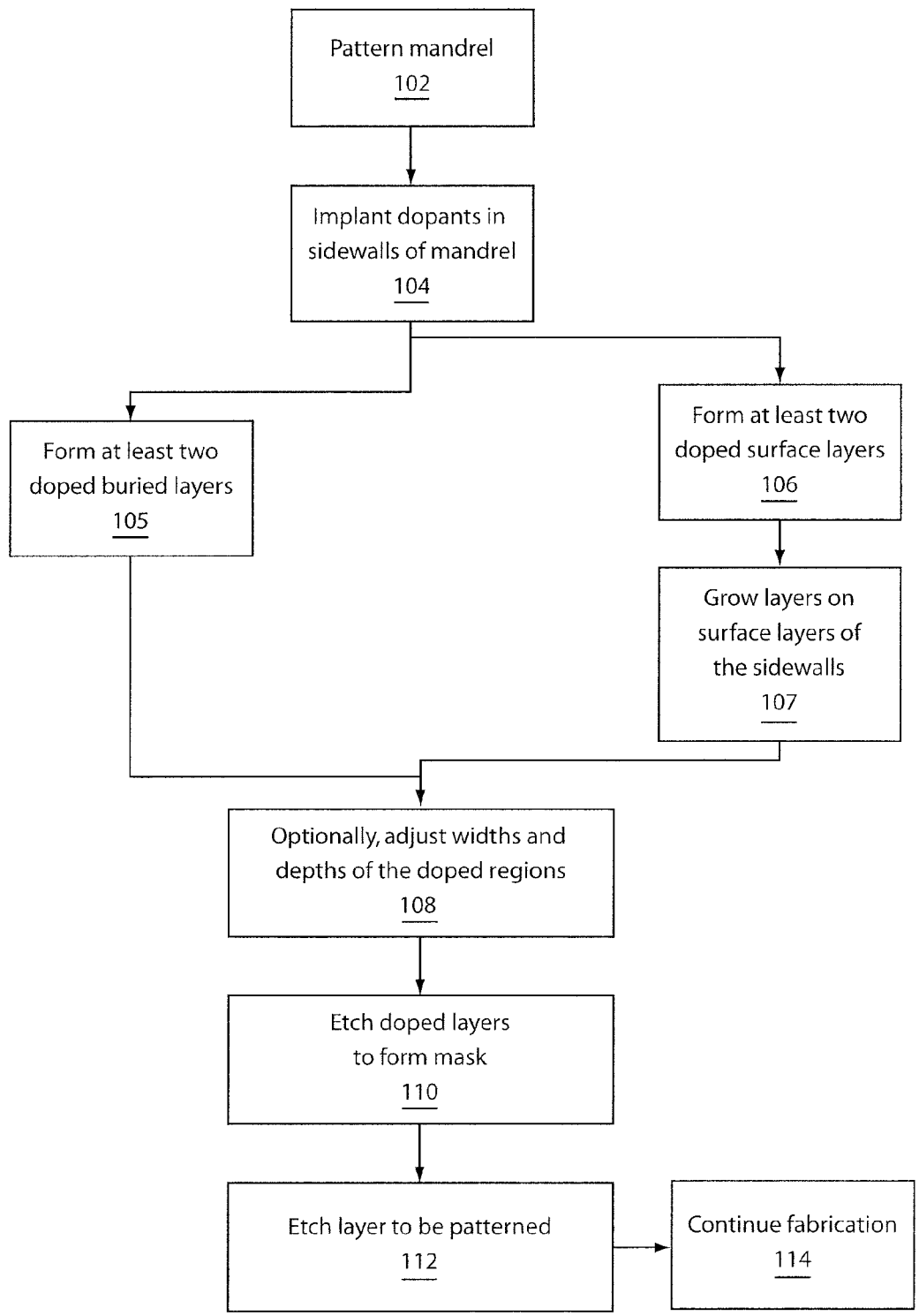
FIG. 12 is a flow diagram showing an illustrative method in accordance with the present principles.

Referring to FIG. 12, a flow diagram for a method for fabricating an integrated circuit is illustratively depicted. In block 102, a mandrel is patterned over a layer to be patterned by the present method. A cap layer or mask layer formed on a mandrel layer may also be patterned. The layer to be patterned may include a substrate and/or other layers in the semiconductor device design.

In block 104, dopants are implanted into exposed sidewalls of the mandrel using an angled implantation process to form at least two doped layers having at least one undoped region adjacent to the doped layers. The implanting of dopants may include implanting dopants into exposed sidewalls of the mandrel using at least two angled implantation processes to form at least two buried layers in block 105. The mandrel may include amorphous silicon or polysilicon, and the dopants may include, e.g., arsenic, although other materials are also contemplated.

In an alternate embodiment, a surface doping may be performed in block 106 to form at least one surface doped layer. In block 107, epitaxial undoped regions may be grown on the at least one surface doped layer. Other processes such as atomic depositions, etc. may also be employed.

In block 108, the at least two doped layers may have at least one of different widths and different depths from a sidewall surface of the mandrel. This is achieved by adjusting dopant types, densities, target material, dopant energies, angle of implantation and/or other parameters.

In block 110, the doped layers are selectively etched away to form pillars from the undoped regions. The selective etching of the doped layers to form pillars from the undoped regions preferably includes forming a three pillar structure to provide a triple pattern density structure in a single surface image transfer process sequence. The pillars form a mask feature. The pillars may have a spacing of less than a minimum feature size achievable by lithography.

In block 112, the layer to be patterned is etched using the pillars as an etch mask to form features for an integrated circuit device. The features for the integrated circuit device preferably include a width of less than a minimum feature size achievable with lithography. In one embodiment, the layer to be patterned is a semiconductor substrate and etching the layer to be patterned includes forming fin features for fin field effect transistor devices.

In block 114, further processing is performed. For example, finFETs are constructed or other devices or components are fabricated.

Having described preferred embodiments for multiplying pattern density by single sidewall imaging transfer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an integrated circuit, comprising:
   patterning a mandrel over a layer to be patterned;
   implanting dopants into exposed sidewalls of the mandrel to form at least two doped layers having at least one undoped region adjacent to the doped layers;
   selectively etching away the doped layers to form pillars from the undoped regions; and etching the layer to be patterned using the pillars as an etch mask to form features for an integrated circuit device.

2. The method as recited in claim 1, wherein implanting dopants includes implanting dopants into exposed sidewalls of the mandrel using at least one angled implantation processes to form at least two buried layers.

3. The method as recited in claim 2, wherein selectively etching away the doped layer to form pillars from the undoped regions includes forming a three pillar structure to provide a triple pattern density structure in a single surface image transfer process sequence.

4. The method as recited in claim 2, wherein the at least two doped layers have at least one of different widths and different depths from a sidewall surface of the mandrel.

5. The method as recited in claim 1, wherein the layer to be patterned is a substrate and etching the layer to be patterned includes forming fin features for fin field effect transistor devices.

6. The method as recited in claim 1, wherein the mandrel includes one of amorphous silicon and polysilicon, and implanting dopants includes implanting arsenic into the exposed sidewalls.

7. The method as recited in claim 1, wherein the features for the integrated circuit device include a width of less than a minimum feature size achievable with lithography.

8. The method as recited in claim 1, wherein implanting dopants includes a surface doping to form at least one surface doped layer and the method further comprises epitaxially growing undoped regions on the at least one surface doped layer.

9. The method as recited in claim 1, wherein the pillars form a mask feature having a spacing of less than a minimum feature size achievable by lithography.

10. A method for fabricating an integrated circuit, comprising:
    patterning a mandrel over a substrate, the mandrel having a mask layer formed thereon;
    implanting dopants into exposed sidewalls of the mandrel to form two buried layers having undoped regions adjacent to the buried layers;
    removing the mask layer;
    selectively etching away the buried layers to form pillars from the undoped regions; and etching the substrate using the pillars as an etch mask to form features for an integrated circuit device.

11. The method as recited in claim 10, wherein implanting dopants includes implanting dopants into exposed sidewalls of the mandrel using at least one angled implantation process to form the buried layers.

12. The method as recited in claim 11, wherein selectively etching away the buried layers to form pillars from the undoped regions includes forming a three pillar structure to provide a triple pattern density structure in a single surface image transfer process sequence.

13. The method as recited in claim 10, wherein the two buried layers have at least one of different widths and different depths from a sidewall surface of the mandrel.

14. The method as recited in claim 10, wherein the features for the integrated circuit device include a width of less than a minimum feature size achievable with lithography.

15. A method for fabricating an integrated circuit, comprising:
    patterning a mandrel over a substrate, the mandrel having a mask layer formed thereon;
    implanting dopants into exposed sidewalls of the mandrel to form two surface layers having an undoped region therebetween;
    epitaxially growing undoped regions on two surface layers of the exposed sidewalls;
    removing the mask layer;
    selectively etching away the surface layers to form pillars from the undoped regions; and etching the substrate using the pillars as an etch mask to form features for an integrated circuit device.

16. The method as recited in claim 15, wherein implanting dopants includes implanting dopants into exposed sidewalls of the mandrel using at least two angled implantation processes to form the surface layers.

17. The method as recited in claim 16, wherein selectively etching away the buried layers to form pillars from the undoped regions includes forming a three pillar structure to provide a triple pattern density structure in a single surface image transfer process sequence.

18. The method as recited in claim 15, wherein the two surface layers have at least one of different widths and different depths from a sidewall surface of the mandrel.

19. The method as recited in claim 15, wherein the features for the integrated circuit device include a width of less than a minimum feature size achievable with lithography.

* * * * *